United States Patent
Kondo et al.

(10) Patent No.: US 7,230,224 B2
(45) Date of Patent: Jun. 12, 2007

(54) SOLID STATE IMAGE PICKUP DEVICE WITH TWO PHOTOSENSITIVE FIELDS PER ONE PIXEL

(75) Inventors: Ryuji Kondo, Miyagi (JP); Tetsuo Yamada, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 507 days.

(21) Appl. No.: 10/348,771

(22) Filed: Jan. 23, 2003

(65) Prior Publication Data
US 2003/0141564 A1    Jul. 31, 2003

(30) Foreign Application Priority Data
Jan. 25, 2002    (JP)    ............... 2002-016835

(51) Int. Cl.
*H04N 5/335*    (2006.01)

(52) U.S. Cl. ............... 250/208.1; 348/315; 257/232

(58) Field of Classification Search ............. 250/208.1; 257/442, 443, 232, 222; 348/272; 358/482–483
See application file for complete search history.

(56) References Cited

U.S. PATENT DOCUMENTS 5,714,753 A    2/1998    Park ............... 250/208.1
6,274,917 B1    8/2001    Fan et al. ............... 257/432
6,831,692 B1 *    12/2004    Oda ............... 348/315

FOREIGN PATENT DOCUMENTS

| EP | 0 249 991 A | 12/1987 |
| EP | 1 091 412 A | 4/2001 |
| JP | 05 175471 A | 7/1993 |
| JP | HEI5-207376 | 8/1993 |
| JP | 9-205589 | 8/1997 |
| JP | 2001-57420 | 2/2001 |
| JP | 2003-009010 A | 1/2003 |

* cited by examiner

*Primary Examiner*—Thanh X. Luu
*Assistant Examiner*—Tony Ko
(74) *Attorney, Agent, or Firm*—Arent Fox PLLC

(57) ABSTRACT

A solid state image pickup device having: a semiconductor substrate having a light receiving area; a number of pixels formed in the light receiving area of the semiconductor substrate in a matrix shape, each of the pixels having a main photosensitive field having a relatively large area and a subsidiary photosensitive field having a relatively small area; a main color filter array formed above the semiconductor substrate and covering at least the main photosensitive fields in register with the respective pixels; and a micro lens array formed on the color filter array and covering at least the main photosensitive fields in register with the respective pixels, wherein an image signal can be selectively picked up from either one of the main and subsidiary photosensitive fields. A solid state image pickup device having a high resolution can be provided.

8 Claims, 4 Drawing Sheets

SOLID STATE IMAGE PICKUP DEVICE WITH TWO PHOTOSENSITIVE FIELDS PER ONE PIXEL

CROSS REFERENCE TO RELATED APPLICATION

This application is based on Japanese Patent Application No. 2002-016835, filed on Jan. 25, 2002, the entire contents of which are incorporated herein by reference.

BACKGROUND OF THE INVENTION

A) Field of the Invention

The present invention relates to a solid state image pickup device and more particularly to a solid state image pickup device having a number of pixels each having two photosensitive fields.

B) Description of the Related Art

A CCD solid state image pickup device and a MOS solid state image pickup device are known, the former transferring signal charges by using charge coupled devices (CCDs) and the latter amplifying and outputting an image signal from a photosensitive element. As photosensitive elements, photodiodes are mainly used and a number of photodiodes (pixels) are disposed in a light receiving area in a matrix shape. As the layout of photosensitive elements, a square matrix layout and a honeycomb layout are known. The former disposes photosensitive elements along row and column directions at constant pitches and the latter disposes photosensitive elements along row and column directions by shifting the positions of every second pixels (e.g., by shifting the positions by a half pitch).

For a solid state image pickup device having on-chip color filters, a color filter layer is formed on a semiconductor chip with photosensitive elements and signal transfer units. In many cases, on-chip micro lenses are disposed on the color filter layer to efficiently guide incident light to photosensitive elements.

In order to obtain image signals having a high resolution, it is desired to increase the number of pixels. Although all the pixels have generally the same shape, image signals obtained from respective pixels do not have the same function and importance. For example, in order to obtain a luminance signal which governs the resolution, it is necessary to use a signal having the amount of light containing light in the whole visible range or in a green range. If a luminance signal is obtained from a green signal, a large number of green pixels are desired in order to obtain an image signal having a high resolution.

SUMMARY OF THE INVENTION

An object of this invention is to provide a solid state image pickup device having a high resolution.

Another object of the invention is to provide a solid image pickup device capable of selectively using a function in accordance with an application field.

Still another object of the invention is to provide a solid state image pickup device having an auxiliary function and minimizing the degree of lowering the main function to be caused by the auxiliary function.

Still another object of the invention is to provide a solid state image pickup device capable of increasing a resolution and preventing a sensitivity from being lowered, without increasing the area occupied by pixels.

According to one aspect of the present invention, there is provided a solid state image pickup device comprising: a semiconductor substrate having a light receiving area; a number of pixels formed in the light receiving area of the semiconductor substrate in a matrix shape, each of the pixels having a main photosensitive field having a relatively large area and a subsidiary photosensitive field having a relatively small area; a main color filter array formed above the semiconductor substrate and covering at least the main photosensitive fields in register with the respective pixels; and a micro lens array formed on the color filter array and covering at least the main photosensitive fields in register with the respective pixels, wherein an image signal can be selectively picked up from either one of the main and subsidiary photosensitive fields.

Image signals having a high resolution can be read and an image having a high quality can be reproduced.

DESCRIPTION OF THE PREFERRED EMBODIMENTS

Figure 1A:
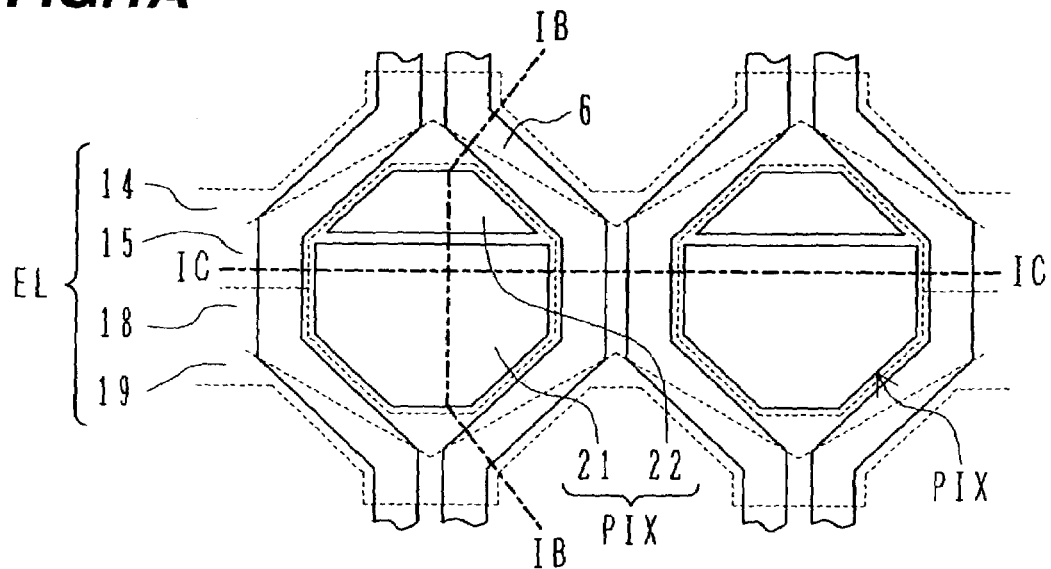
FIGS. 1A, 1B and 1C are a plan view and cross sectional views showing the structure of a solid state image pickup device.

Description will be made on the preferred embodiments of the invention, referring to the drawings.

FIGS. 1A to 1C and FIGS. 2A to 2C are plan views, cross sectional views and a block diagram of a solid state image pickup device according to an embodiment of the invention. In FIG. 1A, two pixels PIX are shown side by side. Each pixel PIX has two photodiode areas 21 and 22. The photodiode area 21 has a relatively large area and constitutes a main photosensitive field. The photodiode area 22 has a relatively small area and constitutes a subsidiary photosensitive field. A vertical charge transfer path (VCCD) 6 is disposed on the right side of each pixel PIX.

The honeycomb layout is used as the pixel layout. Upper and lower pixels of the two pixels PIX shown are disposed shifted by a half pitch in the lateral direction. VCCD 6 disposed on the right side of respective pixels PIX are used for reading and transferring charges from the upper and lower pixels PIX.

As shown by broken lines, polysilicon electrodes 14, 15, 18 and 19 (collectively indicated by EL) for four-phase drive are disposed above VCCDs 6. For example, if the transfer electrodes are formed of two polysilicon layers, the transfer electrodes 14 and 18 are formed of the first polysilicon layer and the transfer electrodes 15 and 19 are formed of the second polysilicon layer. The transfer electrode 14 also controls read-out operation of charges from the subsidiary photosensitive field 22 to VCCD 6. The transfer electrode 15 also controls read-out operation of charges from the main photosensitive field 21 to VCCD 6.

Figure 1B:
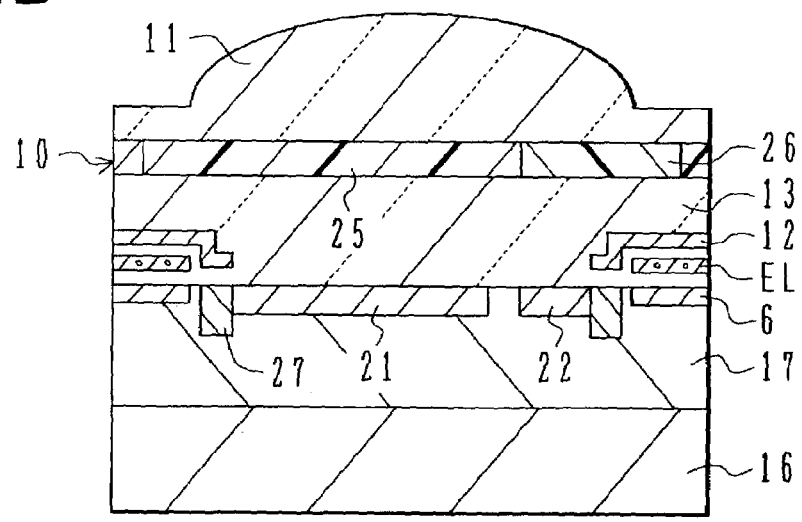
Figure 1C:
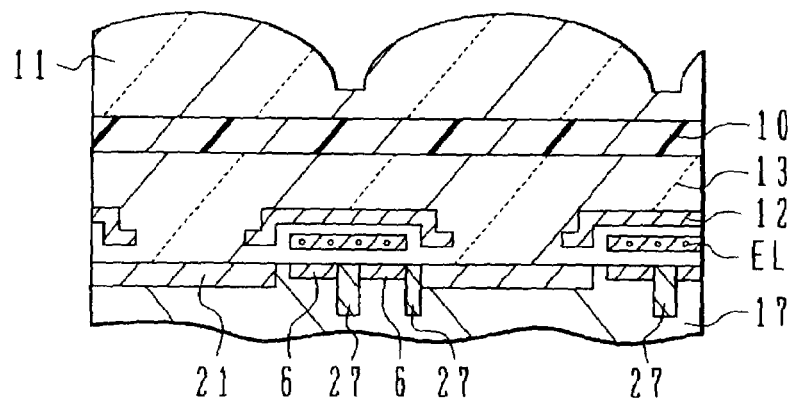

FIGS. 1B and 1C are cross sectional views taken along one-dot chain lines IB—IB and IC—IC shown in FIG. 1A.

In the surface layer of an n-type semiconductor substrate 16, a p-type well 17 is formed. In the surface layer of the p-type well 17, two n-type regions 21 and 22 are formed, which constitute two photodiodes. A $p^+$-type region 27 is a channel stopper region for electrically separating pixels, VCCDs and the like.

As shown in FIG. 1C, near the n-type region 21 constituting the photodiode, an n-type region 6 is formed constituting VCCD. The p-type region 17 between the n-type regions 21 and 6 constitutes a read transistor with the n-type regions 21 and 6.

On the surface of the semiconductor substrate, an insulating layer such as a silicon oxide film is formed, and the transfer electrodes EL of polysilicon are formed on the insulating layer. The transfer electrodes EL cover the upper area of VCCD 6. An insulating film such as a silicon oxide film is formed on the transfer electrodes EL. A light shielding film 12 of tungsten or the like is formed on the insulating film, covering the constituent elements such as VCCDs and having openings above the photodiodes. Covering the light shielding film 12, an interlayer insulating film 13 of phosphosilicate glass or the like is formed and the upper surface thereof is planarized.

On the interlayer insulating film 13, a color filter layer 10 is formed. The color filter layer 10 includes three or more color areas such as a red area 25 and a green area 26. On the color filter layer 10, micro lenses 11 of resist or the like are formed in register with the respective pixels.

As shown in FIG. 1B, one micro lens 11 is formed for each pixel. Under the micro lens 11, two types of color filters 25 and 26 are disposed. The color filter 25 is formed covering the upper area of the main photosensitive field 21 and disposed at such a position that the light incident upon the photosensitive field 21 at least along the vertical direction can transmit through the color filter 25. The color filter 26 is disposed at such a position that the light transmitted through the filter becomes mainly incident upon the subsidiary photosensitive field 22. The micro lens 11 has a function of converging downward incident light into the opening defined by the light shielding film 12. Two micro lenses may be formed in correspondence with the photosensitive fields 21 and 22.

Figure 2A:
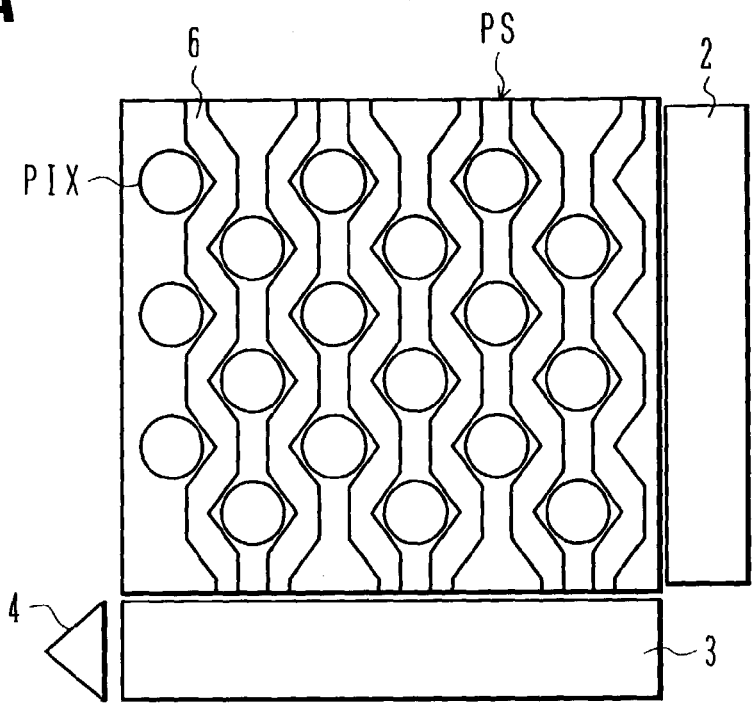
FIGS. 2A, 2B and 2C are plan views and a block diagram showing the overall structure of the solid state image pickup device shown in FIGS. 1A to 1C.

FIG. 2A shows the layout of pixels PIX and VCCDs 6 in a light receiving area PS. Pixels PIX are disposed at each row and at every second column and also at each column and at every second row. This layout is the honeycomb layout. Each pixel PIX has the main and subsidiary photosensitive fields as described above. VCCD 6 is disposed near each column in a zigzag way.

On the right side of the light receiving area PS, a VCCD driver 2 for driving the vertical transfer electrodes EL is disposed. A horizontal charge transfer path (HCCD) 3 is disposed at a downstream side of the light receiving area PS to receive charges from VCCDs 6 and transfer the charges in the horizontal direction. An output amplifier 4 is disposed at the left of HCCD 3.

Figure 2B:
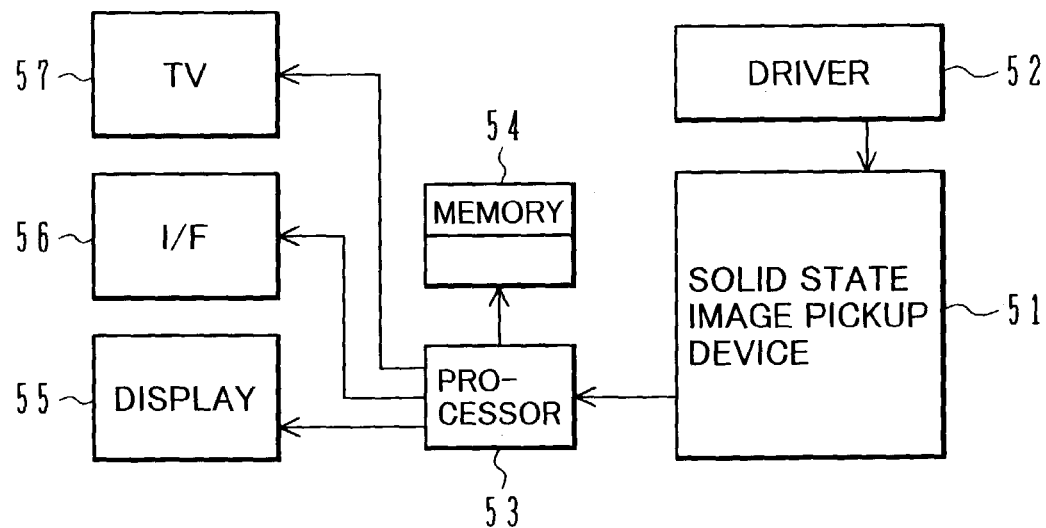

FIG. 2B shows the system configuration of a solid state image pickup device. A solid state image pickup device 51 is fabricated on a semiconductor chip and includes a light receiving area PS and a peripheral circuit area. A driver 52 supplies signals for driving the solid state image pickup device. The driver 52 supplies a signal for reading charges accumulated in the main photosensitive field and a signal for reading charges accumulated in the subsidiary photosensitive field.

Two types of output signals from the solid state image pickup device 51 are processed by a processor 53. A memory 54 has two areas in which image signals supplied from the processor 53 are stored. Image signals for the main photosensitive fields are stored in one memory area, and image signals for the subsidiary photosensitive fields are stored in the other memory area. Image signals processed by the processor 53 are supplied to a display unit 55, an interface 56, a television 57 and the like.

In the structure shown in FIGS. 1B and 1C, light beams transmitted through the color filters of two types are not always perfectly separated and enter the two photosensitive fields 21 and 22. Namely, there is a possibility of color mixture in the photosensitive field. However, light beams transmitted through the micro lens 11 always pass either of the two types of color filters 25 and 26. Possible color mixture in the photosensitive fields 21 and 22 is the mixture of only two colors.

A ratio of light transmitted through one color filter and entering one photosensitive field to light entering the other photosensitive field and a ratio of light transmitted through the other color filter and entering the other photosensitive field to light entering the one color filter are checked beforehand. Then, a conversion process of converting signals in the two photosensitive fields into signal components of each color is determined and set to the processor 53. The processor can converts the signals in the two photosensitive fields into signal components of each color.

For example, before shipment of the solid state image pickup device, each of red, green and blue beams having a constant illuminance is applied to the whole light receiving area to obtain output signals from the photosensitive fields. How two beams of light having passed through one filter are distributed to the two photosensitive fields can be known from signals in the two photosensitive fields of the same pixel. If lights having passed through two filters enter the two photosensitive fields, each photosensitive field receives a constant amount of two incident light beams. This amount is a fixed value so that the amount of light of a target color can be calculated. The processor 53 stores these amounts beforehand.

Color mixture in the main photosensitive field may be suppressed to a negligible degree and only color mixture in the subsidiary photosensitive field may be eliminated.

In the embodiment, the green filters 26 are disposed above the all subsidiary photosensitive fields 22. By using the signals detected in the subsidiary photosensitive fields, the green signals (luminance signals) at all pixel positions can be obtained. By obtaining the luminance signals at all pixel positions, it is possible to reproduce an image having a high resolution through interpolation if necessary.

An image signal in the main photosensitive field 21 can be processed in the same way as image signals of a usual CCD solid state image pickup device. If necessary, an image may be reproduced from the signals only in the main photosensitive fields.

Figure 2C:
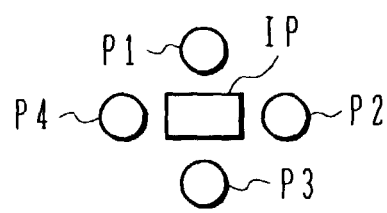

FIG. 2C illustrates how interpolation signals are obtained through interpolation of signals in the subsidiary photosensitive fields. Pixels P1, P2, P3 and P4 are all green subsidiary photosensitive fields. Since the number of pixels based on which the luminance signal is calculated is increased, the resolution can be improved. In a usual Bayer layout, upper and lower two pixels or right and left two pixels are green pixels. Therefore, only an average of two signals is used as the green signal of an interpolation pixel IP.

If there are upper, lower, right and left four green pixels, a signal value of the interpolation pixel can be obtained by using four signal values. For example, if three pixel signals are almost the same and only the remaining one has a different value, this may be the boundary of an object image. In this case, the signal having a different value is neglected, and an average is calculated from the remaining three signals. In this manner, image signals having a high resolution can be obtained. When a signal in the main photosensitive field is processed, image data with a high resolution can be utilized.

Figure 3A:
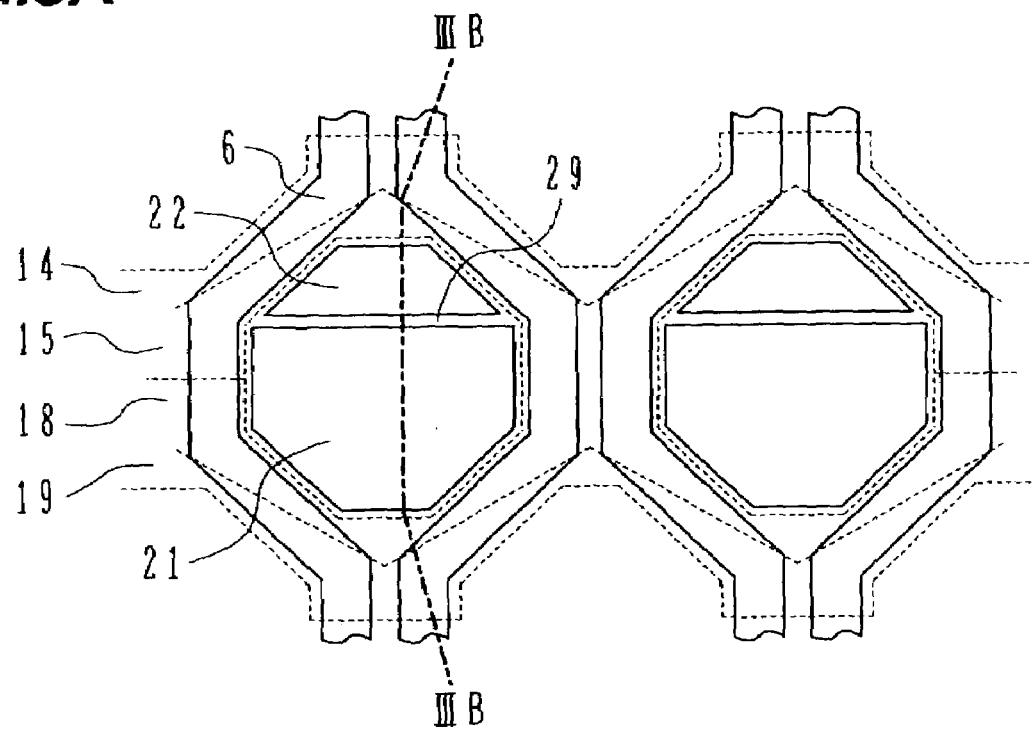
FIGS. 3A and 3B are a plan view and a cross sectional view showing the structure of a solid state image pickup device according to another embodiment of the invention.
Figure 3B:
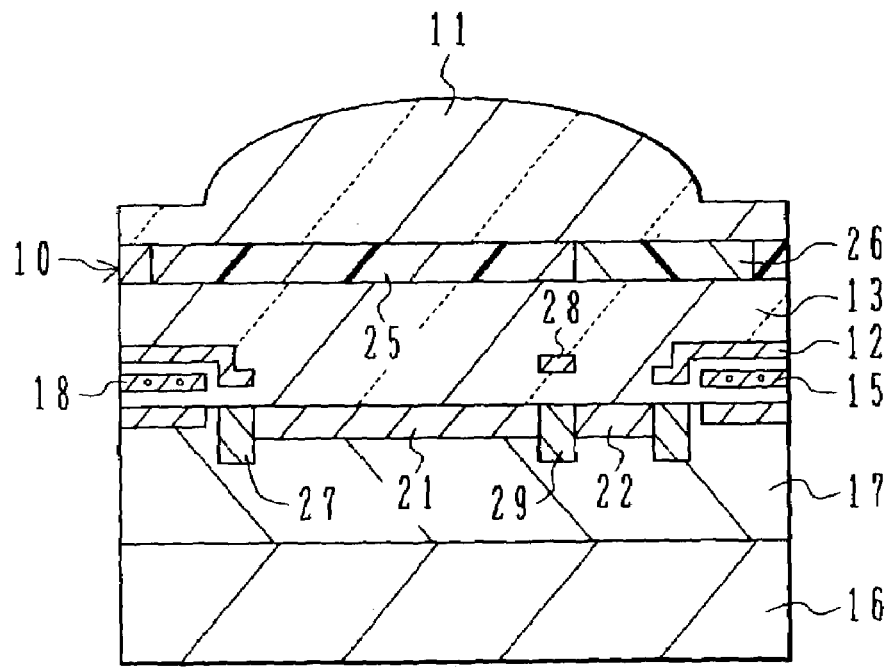

FIGS. 3A and 3B show the structure of a solid state image pickup device according to another embodiment of the invention. A p$^+$-type separation area 29 is formed between main and subsidiary photosensitive fields 21 and 22. Above the separation area 29, a light shielding film 28 is formed. By utilizing the light shielding film 28 and separation area 29, incident light can be efficiently separated and charges once accumulated in the photosensitive fields 21 and 22 can be prevented from being mixed thereafter. The other structures are similar to those of the embodiment shown in FIGS. 1A to 1C and FIGS. 2A to 2C.

Figure 4A:
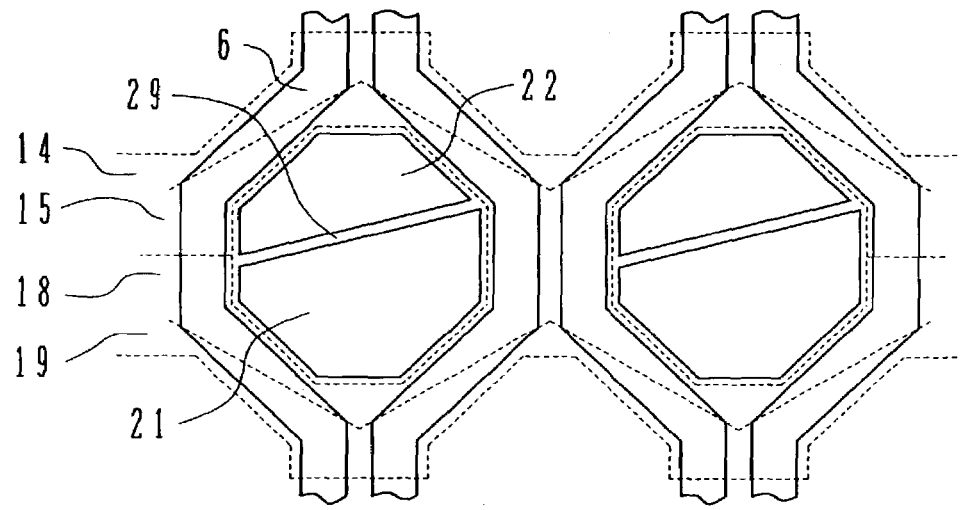
FIGS. 4A to 4D are plan views, a cross sectional view and a schematic diagram showing a modification of the embodiments.
Figure 4B:
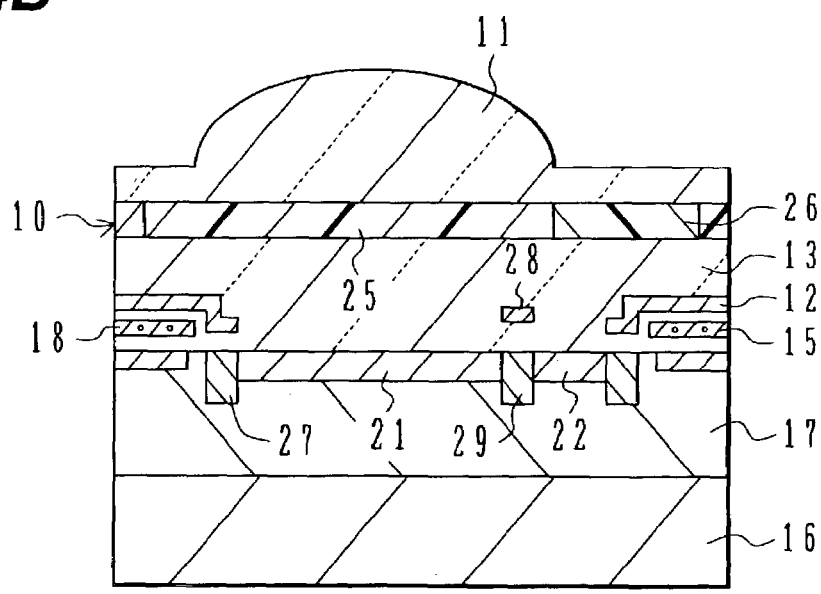

FIGS. 4A and 4B show a modification of the embodiments.

FIG. 4A shows the structure that two photosensitive fields are obliquely separated. The separated shapes of main and subsidiary photosensitive fields 21 and 22 are not limited specifically if accumulated charges can be read to VCCD. The subsidiary photosensitive field is made smaller than the main photosensitive field to suppress a reduction in the area of the main photosensitive field and minimize a decline in the sensitivity.

FIG. 4B shows the structure that a micro lens 11 is formed only on the color filter 25 of the main photosensitive field. A micro lens is not formed on the color filter 26 of the subsidiary photosensitive field. The amount of incident light per area of the subsidiary photosensitive field 22 becomes small. Even if strong light is applied, the subsidiary photosensitive field 22 is not likely to be saturated so that a wide dynamic range can be realized. The color filter of the subsidiary photosensitive field may be omitted to form a transparent field.

Although the solid state image pickup device having the honeycomb layout has been described, the pixel layout of the solid state image pickup device is not limited only to the honeycomb layout.

Figure 4C:
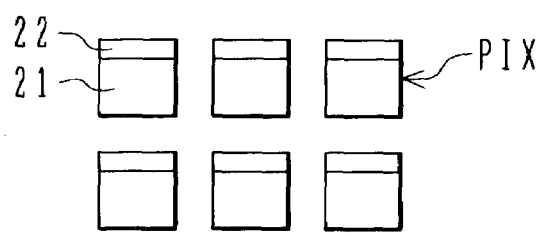

FIG. 4C shows an example of the (n×m) square matrix layout of all pixels PIX. Each pixel PIX has a main photosensitive field 21 and a subsidiary photosensitive field 22. Charges can be selectively transferred from these two photosensitive fields to an adjacent VCCD.

The embodiments may be applied to a solid state image pickup device different from a CCD solid state image pickup device.

Figure 4D:
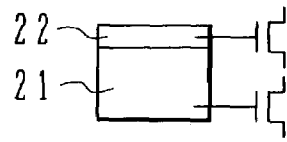

FIG. 4D shows the structure of a MOS solid state image pickup device. Each pixel has photodiodes 21 and 22 in different areas. MOS transistors are connected to the main and subsidiary photosensitive fields 21 and 22 so that charges accumulated in each photosensitive field can be selectively read.

The present invention has been described in connection with the preferred embodiments. The invention is not limited only to the above embodiments. It is apparent that various modifications, improvements, combinations, and the like can be made by those skilled in the art.

What we claim are:

1. A solid state image pickup device comprising:
   a semiconductor substrate having a light receiving area;
   a number of pixels formed in the light receiving area of said semiconductor substrate in a matrix shape of rows and columns, each of said pixels having a main photosensitive field having a relatively large area and a subsidiary photosensitive field having a relatively small area;
   a vertical charge transfer path formed in said semiconductor substrate along each column of said pixels, capable of reading an image signal from either one of the main photosensitive field and the subsidiary photosensitive field of associated pixels;
   a main color filter array formed above said semiconductor substrate and covering at least said main photosensitive fields in register with said respective pixels; and
   a micro lens array formed above said color filter array, one for each of said pixels and covering at least the associated main photosensitive field,
   wherein the number of vertical charge transfer paths is one for each column of pixels.

2. A solid state image pickup device according to claim 1, further comprising:
   a group of vertical transfer electrodes for controlling transfer of charges in said vertical charge transfer paths, said group of vertical transfer electrodes formed above said semiconductor substrate and having a shape capable of reading charges from either one of the main and subsidiary photosensitive fields to said vertical charge transfer path; and
   a horizontal charge transfer path formed in said semiconductor substrate adjacent to one ends of said vertical charge transfer paths, said horizontal charge transfer path receiving charges from said vertical charge transfer paths and transferring charge signals row by row.

3. A solid state image pickup device according to claim 1, further comprising a subsidiary color filter array formed of all green filters formed above said semiconductor substrate and disposed in register with the subsidiary photosensitive field of each of said pixels.

4. A solid state image pickup device according to claim 1, wherein said number of pixels are disposed in a honeycomb configuration, shifting positions of every second pixel both in row and column directions.

5. A solid state image pickup device comprising:
   a semiconductor substrate having a light receiving area;
   a number of pixels formed in the light receiving area of said semiconductor substrate in a matrix shape of rows and columns, each of said pixels having a main photosensitive field having a relatively large area and a subsidiary photosensitive field having a relatively small area;
   a light shielding film formed above said semiconductor substrate, and having apertures, one for each of said pixels exposing the associated main photosensitive field and subsidiary photosensitive field;
   a main color filter array formed above said semiconductor substrate and covering at least said main photosensitive fields in register with said respective pixels; and
   a micro lens array formed above said color filter array, one for each of said pixels and covering at least the associated main photosensitive field, wherein an image signal can be selectively picked up from either one of the main and subsidiary photosensitive fields.

6. A solid state image pickup device according to claim 5, further comprising:
   a group of vertical transfer electrodes for controlling transfer of charges in said vertical charge transfer paths, said group of vertical transfer electrodes formed above said semiconductor substrate and having a shape capable of reading charges from either one of the main and subsidiary photosensitive fields to said vertical charge transfer path; and a horizontal charge transfer path formed in said semiconductor substrate adjacent to one ends of said vertical charge transfer paths, said horizontal charge transfer path receiving charges from said vertical charge transfer paths and transferring charge signals row by row, wherein the number of vertical charge transfer paths is one for each column of pixels.

7. A solid state image pickup device according to claim 5, further comprising a subsidiary color filter array formed of all green filters formed above said semiconductor substrate and disposed in register with the subsidiary photosensitive field of each of said pixels.

8. A solid state image pickup device according to claim 5, wherein said number of pixels are disposed in a honeycomb configuration, shifting positions of every second pixel both in row and column directions.

* * * * *